(12) United States Patent
Moriya et al.

(10) Patent No.: US 8,382,938 B2
(45) Date of Patent: Feb. 26, 2013

(54) GATE VALVE CLEANING METHOD AND SUBSTRATE PROCESSING SYSTEM

(75) Inventors: Tsuyoshi Moriya, Nirasaki (JP); Hiroyuki Nakayama, Nirasaki (JP); Keisuke Kondoh, Nirasaki (JP); Hiroki Oka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/243,462

(22) Filed: Sep. 23, 2011

(65) Prior Publication Data

US 2012/0012254 A1 Jan. 19, 2012

Related U.S. Application Data

(62) Division of application No. 11/969,428, filed on Jan. 4, 2008, now Pat. No. 8,048,235.

(60) Provisional application No. 60/896,940, filed on Mar. 26, 2007.

(30) Foreign Application Priority Data

Jan. 26, 2007 (JP) ................................ 2007-017047

(51) Int. Cl.
*H01L 21/00* (2006.01)
*B08B 9/00* (2006.01)

(52) U.S. Cl. ............... 156/345.31; 156/916; 438/905

(58) Field of Classification Search ............... 134/1, 1.1; 156/345.31
See application file for complete search history.

(56) References Cited

U.S. PATENT DOCUMENTS

| | | | | |
|---|---|---|---|---|
| 5,649,338 A * | 7/1997 | Kato | ............... | 15/304 |
| 5,950,646 A * | 9/1999 | Horie et al. | ............... | 134/105 |
| 2003/0045131 A1 * | 3/2003 | Verbeke et al. | ............... | 438/795 |
| 2005/0082000 A1 * | 4/2005 | Moriya et al. | ............ | 156/345.28 |

FOREIGN PATENT DOCUMENTS

| | | |
|---|---|---|
| JP | 6-196542 | 7/1994 |
| JP | 2006-128578 | 5/2006 |
| JP | 2006-216710 | 8/2006 |

OTHER PUBLICATIONS

Notification of Reasons for Rejection issued Dec. 14, 2011 in Japanese Patent Application No. 2007-017047 (with English translation).
Notification of Reasons for Rejection issued Sep. 13, 2011 in Japanese Patent Application No. 2007-017047 (with English translation).
Office Action issued Apr. 15, 2010, in co-pending U.S. Appl. No. 11/969,428.
Office Action issued Sep. 30, 2010, in co-pending U.S. Appl. No. 11/969,428.
Office Action issued Mar. 17, 2011, in co-pending U.S. Appl. No. 11/969,428.

* cited by examiner

*Primary Examiner* — Michael Kornakov
*Assistant Examiner* — Natasha Campbell
(74) *Attorney, Agent, or Firm* — Oblon, Spivak, McClelland, Maier & Neustadt, L.L.P.

(57) ABSTRACT

A gate valve cleaning method that can clean a gate valve that brings an atmospheric transfer chamber and an internal pressure variable transfer chamber that transfer a substrate into communication with each other or shuts them off from each other without bringing about a decrease in the throughput of a substrate processing system. Before the gate valve brings the atmospheric transfer chamber and the internal pressure variable transfer chamber into communication with each other, the pressure in the internal pressure variable transfer chamber is increased so that the pressure in the internal pressure variable transfer chamber can become higher than the pressure in the atmospheric transfer chamber.

12 Claims, 13 Drawing Sheets

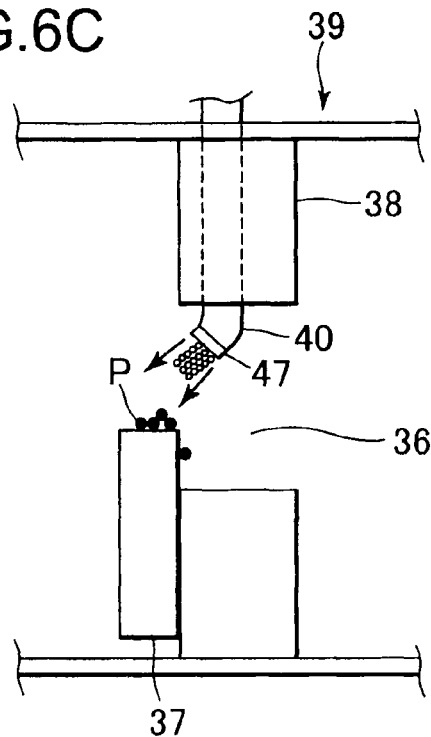
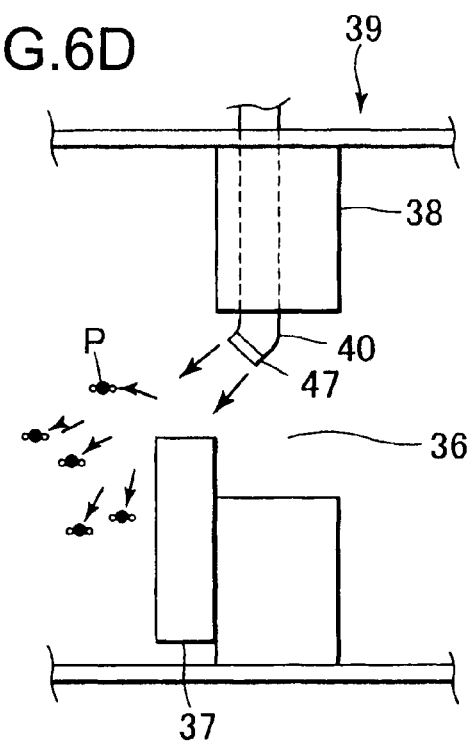

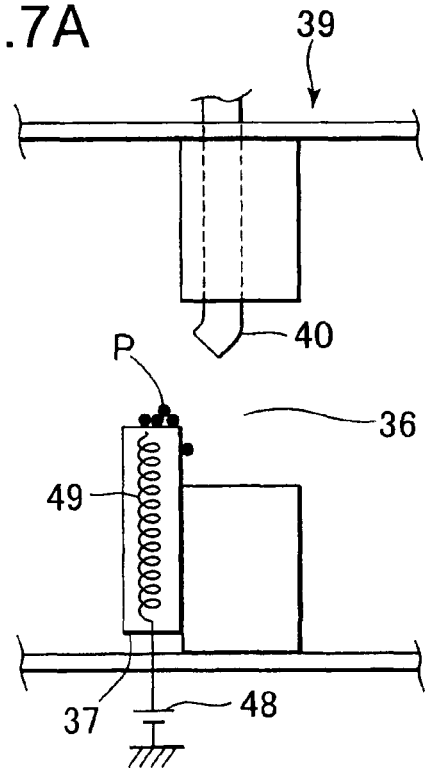
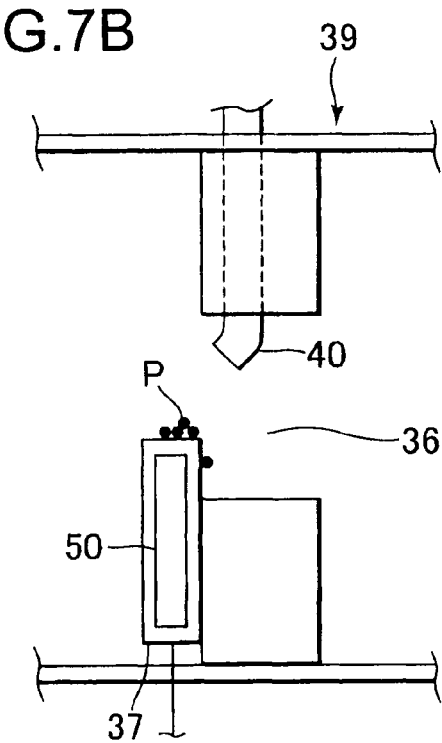

GATE VALVE CLEANING METHOD AND SUBSTRATE PROCESSING SYSTEM

CROSS-REFERENCE TO RELATED APPLICATIONS

This application is a divisional of U.S. Ser. No. 11/969,428 filed Jan. 4, 2008, the entire content of which is incorporated herein by reference. U.S. Ser. No. 11/969,428 is related to and claims priority under 35 U.S.C. §119(e) to U.S. provisional patent application No. 60/896,940, filed Mar. 26, 2007 and claims priority under 35 U.S.C. 119 to Japanese Application No. 2007-017047 filed Jan. 26, 2007.

BACKGROUND OF THE INVENTION

1. Field of the Invention

The present invention relates to a gate valve cleaning method and a substrate processing system, and more particularly to a method of cleaning a gate valve that brings an atmospheric transfer chamber and an inner pressure variable transfer chamber into communication with each other or shuts them off from each other.

2. Description of the Related Art

A substrate processing system that subjects wafers as substrates to plasma processing is comprised of a process module that houses wafers and subjects them to plasma processing, a load-lock module that transfers each wafer into the process module, and a loader module that removes each wafer from a container housing a plurality of wafers and transfers the wafer to the load-lock module.

In general, the load-lock module of the substrate processing system has a chamber in which a wafer is housed. The load-lock module has a function of opening a gate valve on the loader module side, receiving a wafer in the chamber at atmospheric pressure from a transfer chamber of the loader module, closing the gate valve on the loader module side, evacuating the interior of the chamber to a predetermined pressure, opening a gate valve on the process module side, transferring the wafer into the process module, transferring the wafer out of the process module upon completion of processing, closing the gate valve on the process module side, returning the pressure in the chamber to atmospheric pressure, opening the gate valve on the loader module side, and passing the wafer into the loader module (see, for example, Japanese Laid-Open Patent Publication (Kokai) No. 2006-128578).

In the load-lock module, however, there may be a case where, in order to improve the throughput of the substrate processing system or due to a problem concerning accuracy of a pressure gauge, the gate valve on the loader module side is opened to pass a wafer without completely returning the pressure in the chamber to atmospheric pressure, i.e. when the pressure in the chamber is lower than the pressure (atmospheric pressure) in the transfer chamber of the loader module. In this case, the atmosphere in the transfer chamber of the loader module flows into the chamber of the load-lock module.

Meanwhile, as shown in FIG. 8A, a conventional gate valve 70 that is disposed between a loader module and a load-lock module and is opened and closed so that the loader module and the load-lock module can be brought into communication with each other or shut off from each other is comprised of a wafer transfer port 71, and a valve element 72 that is driven vertically as viewed in FIG. 8A by a valve element driving mechanism (not shown) so as to open and close the wafer transfer port 71.

In the gate valve 70, in opening and closing the wafer transfer port 71 via the valve element 72, particles 74 produced through rubbing of the valve element 72 against a member 73 that defines the wafer transfer port 71 become attached to, in particular, the valve element 72 (FIG. 8B). As a result, as described above, when the wafer transfer port 71 is opened via the valve element 72 when the pressure in the load-lock module is lower than the pressure in the transfer chamber (atmospheric pressure) of the loader module, the atmosphere inside the loader module flows into the chamber of the load-lock module (FIG. 8C), and the particles 74 attached to the valve element 72 are scattered away through, for example, a disturbance caused by viscous force of the atmosphere, and the scattered particles 74 enter into the chamber of the load-lock module (FIG. 8D). The particles 74 having entered into the chamber of the load-lock module become attached to and accumulated on surfaces of wafers to be transferred, and the particles 74 attached to and accumulated on the wafer cause defects of patterns formed on the wafers. Thus, if the particles 74 enter into the chamber of the load-lock module, the yield and reliability of devices ultimately manufactured from the wafers are decreased.

Conventionally, to prevent the particles 74 from entering into the chamber of the load-lock module, the particles 74 attached to the gate valve 70, in particular, the valve element 72 have been removed in advance through cleaning such as wiping by an operator. However, operation of the substrate processing system has to be stopped for an operator to carry out cleaning such as wiping, and this has significantly decreased the throughput of the substrate processing system.

SUMMARY OF THE INVENTION

The present invention provides a gate valve cleaning method and a substrate processing system that can clean a gate valve, which brings an atmospheric transfer chamber and an internal pressure variable transfer chamber that transfer a substrate into communication with each other or shuts them off from each other, without bringing about a decrease in the throughput of the substrate processing apparatus.

Accordingly, in a first aspect of the present invention, there is provided a method of cleaning a gate valve in a substrate processing system including the gate valve that brings an atmospheric transfer chamber and an internal pressure variable transfer chamber that transfer a substrate into communication with each other or shuts off the atmospheric transfer chamber and the internal pressure variable transfer chamber from each other, comprising a pressure increasing step of, before the gate valve brings the atmospheric transfer chamber and the internal pressure variable transfer chamber into communication with each other, increasing a pressure in the internal pressure variable transfer chamber so that the pressure in the internal pressure variable transfer chamber becomes higher than a pressure in the atmospheric transfer chamber.

According to the first aspect of the present invention, before the gate valve brings the atmospheric transfer chamber and the internal pressure variable transfer chamber into communication with each other, the pressure in the internal pressure variable transfer chamber is increased so that the pressure in the internal pressure variable transfer chamber becomes higher than the pressure in the atmospheric transfer chamber. Thus, after the pressure in the internal pressure variable transfer chamber becomes higher than the pressure in the atmospheric transfer chamber, the gate valve brings the atmospheric transfer chamber and the internal pressure variable transfer chamber into communication with each other. If foreign matter is attached to the gate valve, the foreign matter is scattered away through, for example, a disturbance caused by viscous force of an internal gas that has flowed from the internal pressure variable transfer chamber into the atmospheric transfer chamber when the atmospheric transfer chamber and the internal pressure variable transfer chamber are brought into communication with each other, and the scattered foreign matter enters into the atmospheric transfer chamber. Air flowing into the atmospheric transfer chamber through a ceiling portion thereof flows out through a bottom portion thereof. Thus, the entered foreign matter as well as air flowing in are caused to flow out from the interior of the substrate processing system. As a result, the foreign matter attached to the gate valve can be removed, and the foreign matter can be discharged from the interior of the substrate processing system. Therefore, even when air in the atmospheric transfer chamber flows into the internal pressure variable transfer chamber, since foreign matter attached to the gate valve has already been removed, the foreign matter can be prevented from entering into the internal pressure variable transfer chamber, and this enables the yield and reliability of semiconductor devices ultimately manufactured to be increased. Further, since foreign matter attached to the gate valve can be removed without the need to carry out cleaning such as wiping by an operator, i.e. without stopping operation of the substrate processing system, the gate valve that brings the atmospheric transfer chamber and the internal pressure variable transfer chamber into communication with each other or shuts them off from each other can be cleaned without bringing about a decrease in the throughput of the substrate processing system.

Accordingly, in a second aspect of the present invention, there is provided a method of cleaning a gate valve in a substrate processing system including the gate valve that comprises a communication port that brings an atmospheric transfer chamber and an internal pressure variable transfer chamber that transfer a substrate into communication with each other and a valve element that opens and closes the communication port, comprising a jetting step of jetting out a removal promoting substance that promotes removal of foreign matter attached to the gate valve toward the valve element from the internal pressure variable transfer chamber side.

According to the second aspect of the present invention, a removal promoting substance that promotes removal of foreign matter attached to the gate valve is jetted out from the internal pressure variable transfer chamber side toward the valve element that opens and closes the communication port. If foreign matter is attached to the valve element, removal of the foreign matter is promoted by the jetted removal promoting substance so that the foreign matter is scattered away, and the scattered foreign matter enters into the atmospheric transfer chamber. Air flowing into the atmospheric transfer chamber through a ceiling portion thereof flows out through a bottom portion thereof. Thus, the entered foreign matter as well as air flowing in are caused to flow out from the interior of the substrate processing system. As a result, the foreign matter attached to the gate valve, in particular, the valve element can be removed, and the foreign matter can be discharged from the interior of the substrate processing system. Therefore, even when air in the atmospheric transfer chamber flows into the internal pressure variable transfer chamber, since foreign matter attached to the gate valve, in particular, the valve element has already been removed, the foreign matter can be prevented from entering into the internal pressure variable transfer chamber, and this enables the yield and reliability of semiconductor devices ultimately manufactured to be increased. Further, since foreign matter attached to the gate valve, in particular, the valve element can be removed without the need to carry out cleaning such as wiping by an operator, i.e. without stopping operation of the substrate processing system, the gate valve that brings the atmospheric transfer chamber and the internal pressure variable transfer chamber into communication with each other or shuts them off from each other can be cleaned without bringing about a decrease in the throughput of the substrate processing system.

The present invention can provide a cleaning method, wherein the removal promoting substance comprises a high-temperature gas.

According to the second aspect of the present invention, the removal promoting substance is comprised of a high-temperature gas. Therefore, if foreign matter including fine foreign matter is attached to the valve element, the foreign matter can be scattered away through, for example, a disturbance caused by viscous force and thermal stress of the high-temperature gas.

The present invention can provide a cleaning method, wherein the removal promoting substance comprises a vibration gas.

According to the second aspect of the present invention, the removal promoting substance is comprised of a vibration gas. Therefore, if foreign matter is attached to the valve element, the foreign matter can be reliably scattered away through, for example, a disturbance caused by viscous force of the vibration gas and a strong physical collision of molecules in the vibration gas.

The present invention can provide a cleaning method, wherein the removal promoting substance comprises a mixture of a first substance in gaseous form and a second substance in one of liquid form and solid form.

According to the second aspect of the present invention, the removal promoting substance is comprised of a mixture of a first substance in gaseous form and a second substance in one of liquid form and solid form. Therefore, if foreign matter is attached to the valve element, the foreign matter can be reliably scattered away through, for example, a disturbance caused by viscous force of the mixture and a physical collision of the second substance in liquid or solid form in the mixture.

The present invention can provide a cleaning method, wherein the substrate processing system comprises a single-pole electrode plate disposed closer to the atmospheric transfer chamber than the valve element, and the removal promoting substance comprises a single-pole ion added gas formed by adding single-pole ions of a reverse polarity to a polarity of the single-pole electrode plate to a gas.

According to the second aspect of the present invention, the removal promoting substance is comprised of a single-pole ion added gas formed by adding single-pole ions of the reverse polarity to the polarity of the single-pole electrode plate, which is disposed closer to the atmospheric transfer chamber than the valve element, to a gas. Therefore, if foreign matter is attached to the valve element, the foreign matter can be reliably scattered away through, for example, a disturbance caused by viscous force of the single-pole ion added gas and attraction for the single-electrode plate caused by an electrostatic force produced through charging the foreign matter on the reverse polarity to the polarity of the single-pole electrode plate due to a physical collision of single-pole ions in the single-pole ion added gas.

The present invention can provide a cleaning method, wherein the valve element is electrically charged, and the removal promoting substance comprises single-pole ions of a reverse polarity to a polarity of the valve element.

According to the second aspect of the present invention, the removal promoting substance is comprised of single-pole ions of the reverse polarity to the polarity of the valve element. Therefore if foreign matter including fine foreign matter is attached to the valve element, the foreign matter can be reliably scattered away through sputtering caused by the single-pole ions.

The present invention can provide a cleaning method, wherein the removal promoting substance comprises radicals or a highly-reactive gas.

According to the second aspect of the present invention, the removal promoting substance is comprised of radicals or a highly-reactive gas. Therefore, if foreign matter including fine foreign matter is attached to the valve element, the foreign matter can be scattered away through chemical reaction with the radicals or a highly-reactive substance included in the highly-reactive gas.

Accordingly, in a third aspect of the present invention, there is provided a substrate processing system including a gate valve that brings an atmospheric transfer chamber and an internal pressure variable transfer chamber that transfer a substrate into communication with each other or shuts off the atmospheric transfer chamber and the internal pressure variable transfer chamber from each other, comprising a pressure increasing mechanism adapted to increase a pressure in the internal pressure variable transfer chamber so that the pressure in the internal pressure variable transfer chamber becomes higher than a pressure in the atmospheric transfer chamber before the gate valve brings the atmospheric transfer chamber and the internal pressure variable transfer chamber into communication with each other.

Accordingly, in a fourth aspect of the present invention, there is provided a substrate processing system including a gate valve that comprises a communication port that brings an atmospheric transfer chamber and an internal pressure variable transfer chamber that transfer a substrate into communication with each other and a valve element that opens and closes the communication port, comprising a jetting mechanism adapted to jet out a removal promoting substance that promotes removal of foreign matter attached to the gate valve toward the valve element from the internal pressure variable transfer chamber side.

The present invention can provide a substrate processing system, wherein the jetting mechanism comprises a removal promoting substance generating unit adapted to generate the removal promoting substance by heating a gas.

The present invention can provide a substrate processing system, wherein the jetting mechanism comprises a removal promoting substance generating unit adapted to generate the removal promoting substance by applying a vibration to a gas.

The present invention can provide a substrate processing system, wherein the vibration comprises an ultrasonic wave.

According to the fourth aspect of the present invention, the vibration gas is produced by applying an ultrasonic wave to a gas. Therefore, vibrations can be reliably applied to a gas.

The present invention can provide a substrate processing system, wherein the jetting mechanism comprises a removal promoting substance generating unit adapted to generate the removal promoting substance by mixing a first substance in gaseous form and a second substance in one of liquid form and solid form.

The present invention can provide a substrate processing system, comprising a single-pole electrode plate disposed closer to the atmospheric transfer chamber than the valve element, and wherein the jetting mechanism comprises a removal promoting substance generating unit adapted to generate the removal promoting substance by adding single-pole ions of a reverse polarity to a polarity of the single-pole electrode plate to a gas.

The present invention can provide a substrate processing system, wherein the jetting mechanism comprises a removal promoting substance generating unit adapted to generate the removal promoting substance by turning a gas into plasma.

According to the fourth aspect of the present invention, the removal promoting substance is comprised of ions and radicals produced by turning a gas into plasma. Therefore, if foreign matter including fine foreign matter is attached to the valve element, the ions and radicals can promote removal of the foreign matter so that the foreign matter is scattered away.

The present invention can provide a substrate processing system, further comprising a charging mechanism adapted to electrically charge the valve element.

According to the fourth aspect of the present invention, the valve element is electrically charged. Therefore, if foreign matter including fine foreign matter is attached to the valve element, the foreign matter can be reliably scattered away through sputtering with ions of the reverse polarity to the polarity of the valve element.

The present invention can provide a substrate processing system, wherein the valve element has therein one of a coil, a heater, and an electrode plate.

According to the fourth aspect of the present invention, the valve element has therein one of a coil, a heater, and an electrode plate. If the valve element has a coil therein, by passing a current through the coil from a direct-current power source, an induced electric field is produced around the valve element. As a result, an electromagnetic stress as a repulsive force that separates foreign matter from the valve element can be caused to act on the foreign matter attached to the valve element, and hence removal of the foreign matter can be promoted. If the valve element has therein a heater, the heater heats the valve element. As a result, a thermal stress as a removal force that removes foreign matter from the valve element can be caused to act on the foreign matter attached to the valve element, and hence removal of the foreign matter can be promoted. If the valve element has therein an electrode plate, a current is passed through the electrode plate from a direct-current power source. As a result, an electrostatic force as a repulsive force that separates foreign matter from the valve element can be caused to act on the foreign matter attached to the valve element, and hence removal of the foreign matter can be promoted.

The present invention can provide a substrate processing system, further comprising at least one of a first suction mechanism disposed closer to the atmospheric transfer chamber than the valve element, and a second suction mechanism disposed closer to the internal pressure variable transfer chamber than the valve element.

According to the fourth aspect of the present invention, there is at least one of a first suction mechanism disposed closer to the atmospheric transfer chamber than the valve element, and a second suction mechanism disposed closer to the internal pressure variable transfer chamber than the valve element. The first suction mechanism or the second suction mechanism sucks foreign matter scattered away from the valve element. As a result, the scattered foreign matter can be reliably discharged from the interior of the substrate processing system.

The present invention can provide a substrate processing system, wherein the jetting mechanism comprises a nozzle.

According to the fourth aspect of the present invention, the removal promoting substance is jetted out from a nozzle.

Therefore, the removal promoting substance can be reliably jetted out toward the valve element.

The features and advantages of the invention will become more apparent from the following detailed description taken in conjunction with the accompanying drawings.

BRIEF DESCRIPTION OF THE DRAWINGS

FIGS. 6C and 6D are process drawings of a cleaning process carried out in a sixth variation of the substrate processing system according to the second embodiment;

FIG. 7A is a sectional view schematically showing the construction of a variation of the substrate processing systems according to the above-mentioned embodiments and shows a case where a valve element has a coil therein;

FIG. 7B is a sectional view schematically showing the construction of a variation of the substrate processing systems according to the above-mentioned embodiments and shows a case where the valve element has a heater therein;

DETAILED DESCRIPTION OF THE PREFERRED EMBODIMENTS

The present invention will now be described with reference to the accompanying drawings showing preferred embodiments thereof.

First, a description will be given of a substrate processing system according to a first embodiment of the present invention.

Figure 1:
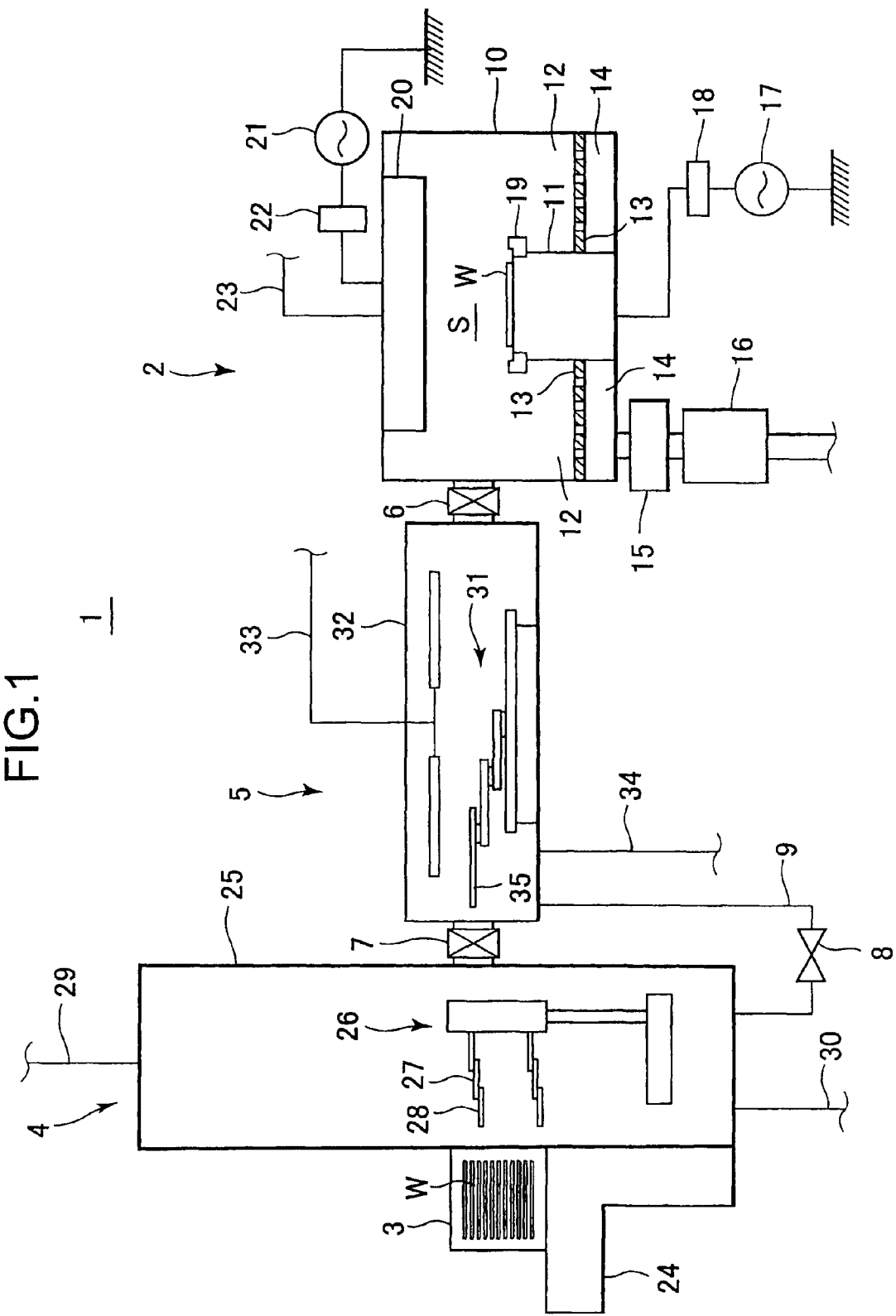
FIG. 1 is a sectional view schematically showing the construction of a substrate processing system according to a first embodiment of the present invention.

FIG. 1 is a sectional view schematically showing the construction of the substrate processing system according to the first embodiment.

As shown in FIG. 1, the substrate processing system 1 is comprised of a process module 2 that subjects semiconductor wafers (hereinafter referred to merely as "wafers") W as substrates to various plasma processing such as deposition, diffusion, and etching, a loader module 4 that removes each wafer W from a wafer cassette 3 housing a predetermined number of wafers W, and a load-lock module 5 that is disposed between the loader module 4 and the process module 2 and is for transferring each wafer W from the loader module 4 into the process module 2 and from the process module 2 into the loader module 4.

Each of the process module 2 and the load-lock module 5 is constructed such that the interior thereof can be evacuated, while the interior of the loader module 4 is always held at atmospheric pressure. The process module 2 and the load-lock module 5 are connected together via a gate valve 6, and the load-lock module 5 and the loader module 4 are connected together via a gate valve 7, described later. Moreover, the interior of the load-lock module 5 and the interior of the loader module 4 are in communication with each other via a communicating pipe 9 having an openable/closable valve 8 disposed part way therealong.

The process module 2 has therein a cylindrical chamber 10 made of metal such as aluminum or stainless steel, and a cylindrical susceptor 11 as a mounting stage on which is mounted a wafer W having a diameter of, for example, 300 mm is disposed in the chamber 10.

An exhaust path 12 that acts as a flow path through which gas in a processing space S, described later, is discharged to the outside of the chamber 10 is formed between the side wall of the chamber 10 and the susceptor 11. An annular exhaust plate 13 is disposed part way along the exhaust path 12, and a manifold 14 as a space downstream of the exhaust plate 13 communicates with an adaptive pressure control valve (APC valve) 15, which is a variable butterfly valve. The APC valve 15 is connected to a turbo-molecular pump (TMP) 16, which is an exhausting pump for evacuation. The exhaust plate 13 prevents leakage of plasma generated in the processing space into the manifold 14. The APC valve 15 controls the pressure in the chamber 10, and the TMP 16 reduces the pressure in the chamber 10 down to a substantially vacuum state.

A radio frequency power source 17 is connected to the susceptor 11 via a matcher 18. The radio frequency power source 17 supplies radio frequency electrical power into the susceptor 11. The susceptor 11 thus acts as a lower electrode. The matcher 18 reduces reflection of the radio frequency electrical power from the susceptor 11 so as to maximize the efficiency of the supply of the radio frequency electrical power into the susceptor 11.

An electrode plate (not shown) for attracting a wafer W through a Johnsen-Rahbek force or a Coulomb force is disposed in the susceptor 11. The wafer W is thus attracted to and held on an upper surface of the susceptor 11. Moreover, an annular focus ring 19 is provided on an upper portion of the susceptor 11 made of silicon or the like and focuses plasma in the processing space S between the susceptor 11 and a shower head 20, descried later, toward the wafer W.

An annular coolant chamber (not shown) is provided inside the susceptor 11. A coolant, for example, cooling water, at a predetermined temperature is circulated through the coolant chamber, so that the temperature of the wafer W being processed on the susceptor 11 is controlled through the temperature of the coolant. It should be noted that helium gas is supplied into a gap between the wafer W and the susceptor 11 and transmits heat of the wafer W to the susceptor 11.

The disk-shaped shower head 20 is disposed in a ceiling portion of the chamber 10. A radio frequency power source 21 is connected to the shower head 20 via a matcher 22. The radio frequency power source 21 supplies radio frequency electrical power into the shower head 20. The shower head 20 thus acts as an upper electrode. The matcher 22 has a similar function to the matcher 18.

A processing gas introducing pipe 23 that supplies a processing gas, for example, a mixed gas of a CF-based gas and other type of gas is connected to the shower head 20. The shower head 20 introduces the processing gas supplied from the processing gas introducing pipe 23 into the processing space S.

In the chamber 10 of the process module 2, the susceptor 11 and the shower head 20 to which radio frequency electrical power is supplied applies the radio frequency electrical power into the processing space S, whereby the processing gas is turned into high-density plasma in the processing space S. The plasma is focused onto the surface of the wafer W by the focus ring 19, whereby the surface of the wafer W is physically/chemically etched.

The loader module 4 has a wafer cassette mounting stage 24 on which the wafer cassette 3 is mounted, and a transfer chamber 25 (atmospheric transfer chamber). The wafer cassette 3 houses, for example, 25 wafers W, which are mounted in a plurality of tiers at equal pitch. The transfer chamber 25 has a rectangular parallelepiped box shape, and has therein a SCARA-type transfer arm 26 for transferring the wafers W.

The transfer arm 26 has an articulated transfer arm arm portion 27 which is constructed such as to be able to bend and extend, and a pick 28 attached to a distal end of the transfer arm arm portion 27. The pick 28 is constructed such that a wafer W is mounted directly thereon. Moreover, the transfer arm 26 is constructed such as to be able to turn and can be freely bent by the transfer arm arm portion 27, and hence a wafer W mounted on the pick 28 can be freely transferred between the wafer cassette 3 and the load-lock module 5.

An inflow pipe 29 through which air flows into the transfer chamber 25 is connected to a ceiling portion of the transfer chamber 25, and an outflow pipe 30 through which air in the transfer chamber 25 flows out is connected to a bottom portion of the transfer chamber 25. Therefore, air flowing in from the ceiling portion of the transfer chamber 25 flows out from the bottom portion of the transfer chamber 25. Thus, air flowing into the transfer chamber 25 forms a down flow.

The load-lock module 5 has a chamber 32 (internal pressure variable transfer chamber) in which is disposed a transfer arm 31 that can bend, extend and turn, a gas supply system 33 (lifting mechanism) that supplies an inert gas such as $N_2$ gas into the chamber 32, and a load-lock module exhaust system 34 that exhausts the interior of the chamber 32. The transfer arm 31 is a SCARA-type transfer arm comprising a plurality of arm portions, and has a pick 35 attached to a distal end thereof. The pick 35 is constructed such that a wafer W is mounted directly thereon.

When a wafer W is to be transferred from the loader module 4 into the process module 2, once the gate valve 7 has been opened, the transfer arm 31 receives the wafer W from the transfer arm 26 in the transfer chamber 25, and once the gate valve 6 has been opened, the transfer arm 31 enters into the chamber 10 of the process module 2 and mounts the wafer W on the susceptor 11. Moreover, when the wafer W is to be transferred from the process module 2 into the loader module 4, once the gate valve 6 has been opened, the transfer arm 31 enters into the chamber 10 of the process module 2 and receives the wafer W from the susceptor 11, and once the gate valve 7 has been opened, the transfer arm 31 passes the wafer W to the transfer arm 26 in the transfer chamber 25.

Figure 2A:
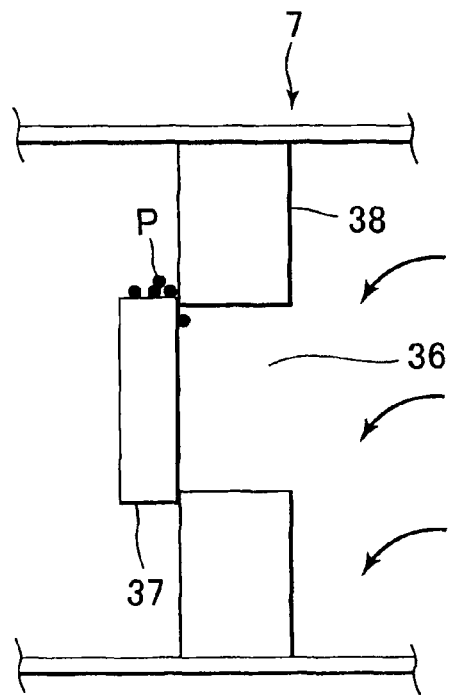
FIGS. 2A and 2B are process drawings of a cleaning process carried out in the substrate processing system according to the first embodiment.

As shown in FIG. 2A, the gate valve 7 is comprised of a wafer transfer port 36 (communicating port), and a valve element 37 that is driven vertically as viewed in FIG. 2A by a valve element driving mechanism (not shown) to open and close the wafer transfer port 36. The gate valve 7 brings the loader module 4 and the load-lock module 5 into communication with each other by opening the wafer transport port 36 with the valve element 37 and shuts them off from each other by closing the wafer transport port 36 with the valve element 37.

In the gate valve 7, when the valve element 37 opens and closes the wafer transfer port 36, particles P produced through rubbing of the valve element 37 against a member 38 that defines the wafer transfer element 36 become attached to, in particular, the valve element 37.

In the substrate processing system according to the present embodiment, particles P attached to the gate valve 7, in particular, the valve element 37 are removed by carrying out a cleaning process, described later.

It should be noted that operation of the component elements of the process module 2, the loader module 4, and the load-lock module 5 constituting the substrate processing system 1 is controlled by a computer (not shown) as a controller of the substrate processing system 1, or by an external server (not shown) as a controller connected to the substrate processing system 1.

Next, a description will be given of the cleaning process carried out in the substrate processing system according to the present embodiment.

Figure 2B:
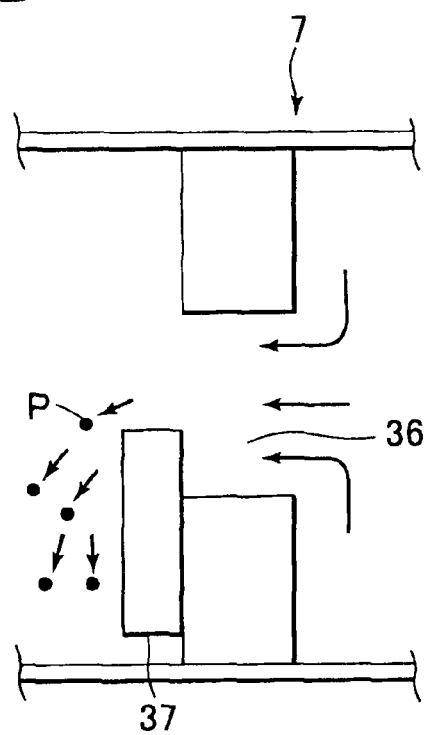

FIGS. 2A and 2B are process drawings of the cleaning process carried out in the substrate processing system according to the present embodiment.

As shown in FIGS. 2A and 2B, before the valve element 37 opens the wafer transfer port 36 so as to bring the loader module 4 and the load-lock module 5 into communication with each other, the gas supply system 33 supplies an inert gas such as $N_2$ gas into the chamber 32 of the load-lock module 5 so that the pressure in the chamber 32 can become higher than the pressure (atmospheric pressure) in the transfer chamber 25 of the loader module 4 (FIG. 2A) (pressure increasing step).

Then, when the valve element 37 opens the wafer transfer port 36 after the pressure in the chamber 32 of the load-lock module 5 becomes higher than the pressure (atmospheric pressure) in the transfer chamber 25 of the loader module 4, the inert gas such as $N_2$ gas in the chamber 32 of the load-lock module 5 flows into the transfer chamber 25 of the loader module 4, and particles P attached to the valve element 37 are scattered away through, for example, a disturbance caused by viscous force of the inert gas such as $N_2$ gas that has flowed in, and the scattered particles P enter into the transfer chamber 25 of the loader module 4 (FIG. 2B). Since air flowing into the transfer chamber 25 from the ceiling portion thereof flows out from the bottom portion thereof, the particles P as well as the air flowing in from the ceiling portion are caused to flow out from the bottom portion. Thus, the particles P attached to the valve element 37 can be removed, and the particles P can be discharged from the interior of the substrate processing system 1.

According to the cleaning process described above with reference to FIGS. 2A and 2B, after the gas supply system 33 supplies an inert gas such as $N_2$ gas into the chamber 32 of the load-lock module 5 so that the pressure in the chamber 32 can become higher than the pressure (atmospheric pressure) in the transfer chamber 25 of the loader module 4, the valve element 37 opens the wafer transfer port 36. If particles P are attached to the valve element 37, the particles P are scattered away through, for example, a disturbance caused by viscous force of the inert gas such as N₂ gas that has flowed in when the wafer transfer port 36 is opened, the scattered particles P enter into the transfer chamber 25 of the loader module 4, and the particles P as well as air flowing into the transfer chamber 25 are caused to flow out from the interior of the substrate processing system 1. Thus, the particles P attached to the gate valve 7, in particular, the valve element 37 can be removed, and the particles P can be discharged from the interior of the substrate processing system 1. Therefore, even when air in the transfer chamber 25 of the loader module 5 flows into the chamber 32 of the load-lock module 5, since particles P attached to the gate valve 7, in particular, the valve element 37 have already been removed, the particles P can be prevented from entering into the chamber 32 of the load-lock module 5, and this enables the yield and reliability of semiconductor devices ultimately manufactured to be increased. Further, since particles P attached to the gate valve 7, in particular, the valve element 37 can be removed without the need to carry out cleaning such as wiping by an operator, i.e. without stopping operation of the substrate processing system 1, the gate valve 7 that brings the loader module 4 and the load-lock module 5 into communication with each other or shuts them off from each other can be cleaned without bringing about a decrease in the throughput of the substrate processing system 1.

Next, a description will be given of a substrate processing system according to a second embodiment of the present invention.

The present embodiment is basically the same as the first embodiment described above in terms of construction and operation, differing from the first embodiment in the construction of the gate valve disposed between the loader module and the load-lock module. Thus, features of the construction and operation that are the same as in the first embodiment will not be described, only features different from those of the first embodiment being described below.

Figure 3A:
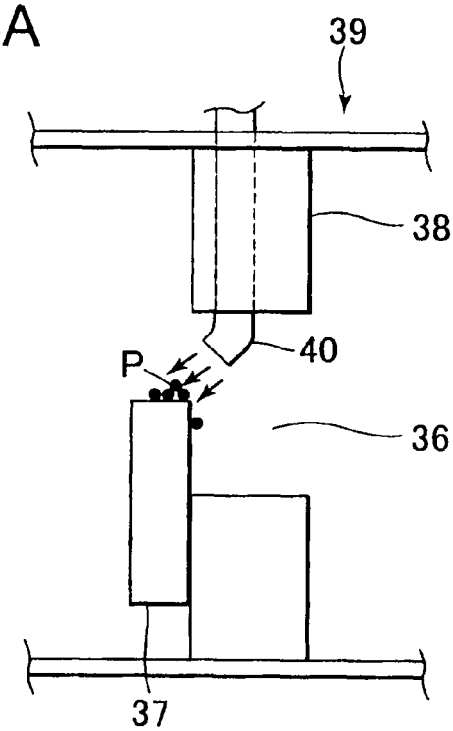
FIGS. 3A and 3B are process drawings of a cleaning process carried out in a substrate processing system according to a second embodiment of the present invention.

As shown in FIG. 3A, a gate valve 39 that is disposed between the loader module 4 and the load-lock module 5 and brings them into communication with each other or shuts them off from each other has a nozzle 40 (jetting mechanism) penetrating from outside through the member 38 that defines the wafer transfer port 36 and having a distal end thereof projecting out into the wafer transfer port 36 and bending toward the valve element 37. The nozzle 40 jets out a gas (removal promoting substance) that promotes removal of particles P attached to the gate valve 39, in particular, the valve element 37 toward the valve element 37.

Next, a description will be given of a cleaning process carried out in the substrate processing system according to the present embodiment.

Figure 3B:
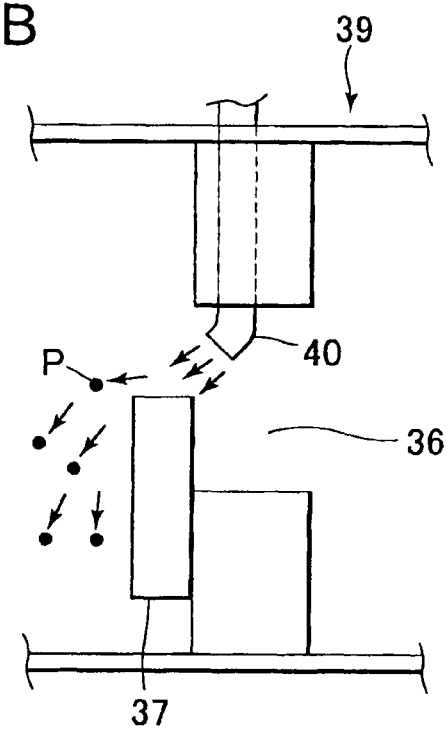

FIGS. 3A and 3B are process drawings of the cleaning process carried out in the substrate processing system according to the present embodiment.

As shown in FIGS. 3A and 3B, first, before a wafer W is transferred in the substrate processing system, the nozzle 40 jets out the above-described gas toward the valve element 37 (FIG. 3A).

Then, particles P attached to the valve element 37 are scattered away through a disturbance caused by viscous force of the jetted gas, and the scattered particles P enter into the transfer chamber 25 of the loader module 4 (FIG. 3B).

According to the cleaning process of FIGS. 3A and 3B described above, before a wafer W is transferred, the nozzle 40 jets out the gas that promotes removal of particles P attached to the gate valve 39, in particular, the valve element 37 toward the valve element 37. If particles P are attached to the valve element 37, the particles P attached to the valve element 37 are scattered away through a disturbance caused by viscous force of the jetted gas, the scattered particles P enter into the transfer chamber 25 of the loader module 4, and the particles P having entered into the transfer chamber 25 as well as air flowing into the transfer chamber 25 are caused to flow out from the interior of the substrate processing system. Thus, the particles P attached to the gate valve 39, in particular, the valve element 37 can be removed, and the particles P can be discharged from the interior of the substrate processing system.

Moreover, in the process of FIGS. 3A and 3B described above, the nozzle 40 may jet out the above-described gas toward the valve element 37 at regular intervals. The gas jet out at regular intervals turns into shock waves. Conventionally, upon attempting to scatter away particles such as fine particles attached to a valve element through a disturbance caused by viscous force of a jetted gas, a layer where the flow velocity of the gas is zero (a boundary layer) has arisen on the surface of the valve element, and hence it has been difficult for the gas to reach fine particles within the boundary layer, and thus it has not been possible to efficiently scatter away the fine particles. In contrast with this, in the present embodiment, since the shock waves can break through the above-described boundary layer, particles P including fine particles attached to the valve element 37 are scattered away through a disturbance caused by a collision with gas molecules. Thus, the particles P including fine particles attached to the valve element 37 can be efficiently removed.

Next, a description will be given of cleaning processes carried out in variations of the substrate processing system according to the present embodiment.

Figure 4A:
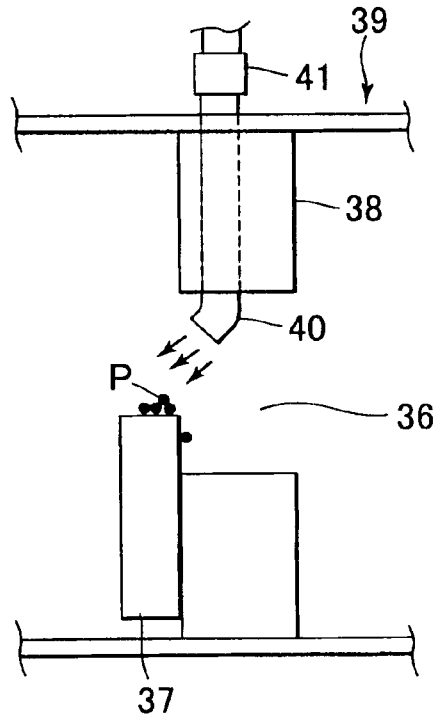
FIGS. 4A and 4B are process drawings of a cleaning process carried out in a first variation of the substrate processing system according to the second embodiment.
Figure 4B:
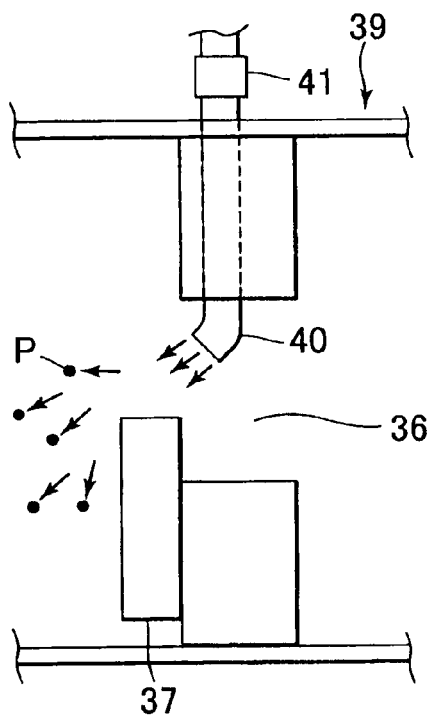

FIGS. 4A and 4B are process drawings of a cleaning process carried out in a first variation of the substrate processing system according to the present embodiment. In this variation, the nozzle 40 has a heating unit 41 (removal promoting substance generating unit) disposed part way therealong, for heating a gas to produce a high-temperature gas (removal promoting substance).

As shown in FIGS. 4A and 4B, first, before a wafer W is transferred in the substrate processing system, the nozzle 40 jets out a high-temperature gas produced by the heating unit 41 toward the valve element 37 (FIG. 4A).

Then, particles P including fine particles attached to the valve element 37 are scattered away through a disturbance caused by viscous force and thermal stress of the jetted high-temperature gas, and the scattered particles P enter into the transfer chamber 25 of the loader module 4 (FIG. 4B).

According to the cleaning process of FIGS. 4A and 4B described above, before the wafer W is transferred, the nozzle 40 jets out the high-temperature gas produced by the heating unit 41 toward the valve element 37. If particles P including fine particles are attached to the valve element 37, the particles P are scattered away through, for example, a disturbance caused by viscous force and thermal stress of the jetted high-temperature gas, the scattered particles P enter into the transfer chamber 25 of the loader module 4, and the particles P having entered into the transfer chamber 25 as well as air flowing into the transfer chamber 25 are caused to flow out from the interior of the substrate processing system. Thus, the particles P including fine particles attached to the gate valve 39, in particular, the valve element 37 can be removed, and the particles P can be discharged from the interior of the substrate processing system.

It should be noted that in the present variation, since the high-temperature gas is jetted out toward the valve element 37, the valve element 37 must have heat resistance. Accordingly, rubber with heat resistance having few double links or no double links in a main chain of rubber molecules such as a heat-resistant fluoro rubber O-ring, a FLID O-ring, a FLID ARMOR O-ring, a SPOQ ARMOR O-ring, a HYREC ARMOR O-ring, an ULTIC ARMOR O-ring, or a LABE ARMOR O-ring is used as an O-ring for the valve element 37 according to the temperature of the high-temperature gas.

Figure 4C:
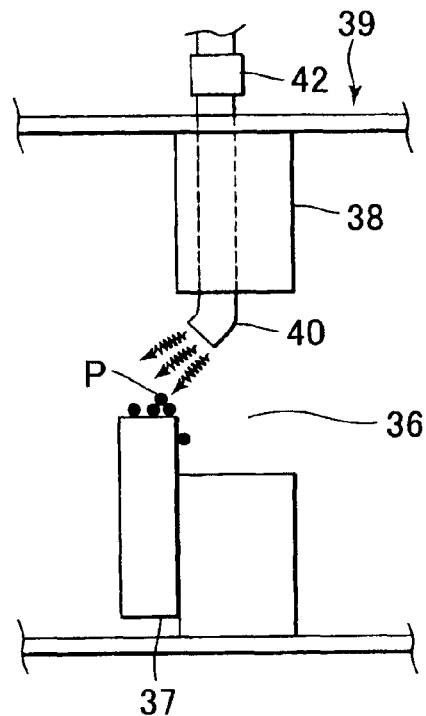
FIGS. 4C and 4D are process drawings of a cleaning process carried out in a second variation of the substrate processing system according to the second embodiment.
Figure 4D:
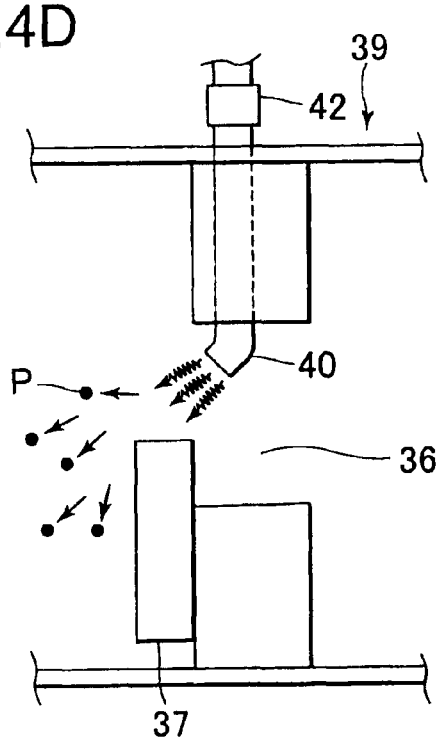

FIGS. 4C and 4D are process drawings of a cleaning process carried out in a second variation of the substrate processing system according to the present embodiment. In this variation, the nozzle 40 has an ultrasonic wave applying unit 42 (removal promoting substance generating unit) disposed part way therealong, for applying an ultrasonic wave to a gas to produce a vibration gas (removal promoting substance).

As shown in FIGS. 4C and 4D, first, before a wafer W is transferred in the substrate processing system, the nozzle 40 jets out a vibration gas produced by the ultrasonic wave applying unit 42 toward the valve element 37 (FIG. 4C).

Then, particles P attached to the valve element 37 are reliably scattered away through, for example, a disturbance caused by viscous force of the vibration gas and a strong physical collision of molecules in the vibration gas, and the scattered particles P enter into the transfer chamber 25 of the loader module 4 (FIG. 4D).

According to the cleaning process of FIGS. 4C and 4D described above, before the wafer W is transferred, the nozzle 40 jets out the vibration gas produced by the ultrasonic wave applying unit 42 toward the valve element 37. If particles P are attached to the valve element 37, the particles P are reliably scattered away through, for example, a disturbance caused by viscous force of the vibration gas and a strong physical collision of molecules in the vibration gas, the scattered particles P enter into the transfer chamber 25 of the loader module 4, and the particles P having entered into the transfer chamber 25 as well as air flowing into the transfer chamber 25 are caused to flow out from the interior of the substrate processing system. Thus, the particles P attached to the gate valve 39, in particular, the valve element 37 can be reliably removed, and the particles P can be discharged from the interior of the substrate processing system.

Although in the present variation, the vibration gas is produced by applying an ultrasonic wave to a gas, the vibration gas may be produced by applying a sound wave with a lower frequency than an ultrasonic wave to a gas.

Figure 5A:
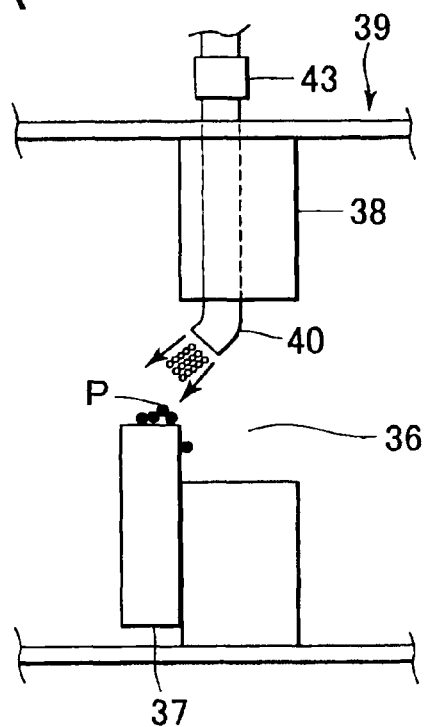
FIGS. 5A and 5B are process drawings of a cleaning process carried out in a third variation of the substrate processing system according to the second embodiment.
Figure 5B:
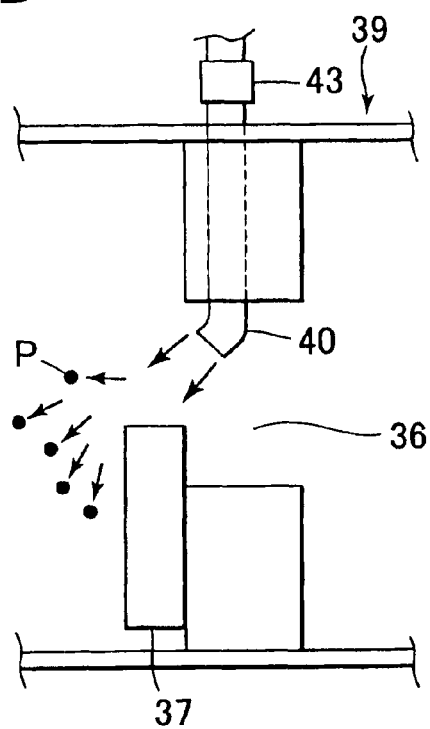

FIGS. 5A and 5B are process drawings of a cleaning process carried out in a third variation of the substrate processing system according to the present embodiment. In this variation, the nozzle 40 has a mixing unit 43 (removal promoting substance generating unit) disposed part way therealong, for mixing a first substance in gaseous form and a second substance in liquid or solid form to produce an aerosol (removal promoting substance or mixture). It should be noted that the second substance is preferably a substance that vaporizes at room temperature, e.g. carbon dioxide or argon.

As shown in FIGS. 5A and 5B, first, before a wafer W is transferred in the substrate processing system, the nozzle 40 jets out an aerosol produced by the mixing unit 43 toward the valve element 37 (FIG. 5A).

Then, particles P including fine particles attached to the valve element 37 are reliably scattered away through, for example, a disturbance caused by viscous force of the jetted aerosol and a physical collision of the second substance in liquid or solid form in the aerosol, and the scattered particles P enter into the transfer chamber 25 of the loader module 4 (FIG. 5B).

According to the cleaning process of FIGS. 5A and 5B described above, before the wafer W is transferred, the nozzle 40 jets out the aerosol produced by the mixing unit 43 toward the valve element 37. If particles P are attached to the valve element 37, the particles P are reliably scattered away through, for example, a disturbance caused by viscous force of the jetted aerosol and a strong physical collision of the second substance in liquid or solid form, the scattered particles P enter into the transfer chamber 25 of the loader module 4, and the particles P having entered into the transfer chamber 25 as well as air flowing into the transfer chamber 25 are caused to flow out from the interior of the substrate processing system. Thus, the particles P including fine particles attached to the gate valve 39, in particular, the valve element 37 can be reliably removed, and the particles P can be discharged from the interior of the substrate processing system.

Although in the present variation, the aerosol is produced by mixing the first substance in gaseous form and the second substance in liquid or solid form, a substance in gaseous form having a high melting point may be jetted out from the nozzle 40 and turned into an aerosol using temperature decrease caused by adiabatic expansion occurring at the time of jetting. Also, a substance in gaseous form having a high melting point may be turned into an aerosol by cooling in advance with a cooler. Examples of a substance having a high melting point which may be used in this case include water, alcohol, organic solvent, and surface-active agent. It should be noted that when a surface-active agent is jetted out from the nozzle 40 and becomes attached to particles P, it penetrates through an interface between the particles P and the valve element 37 to remove the particles P from the valve element 37. Thus, the particles P attached to the valve element 37 can be more reliably removed.

Also, a substance such as $SiO_2$ that never forms defects on a wafer even when it becomes attached to or accumulated on the surface of the wafer may be used as the second substance in liquid or solid form.

Figure 5C:
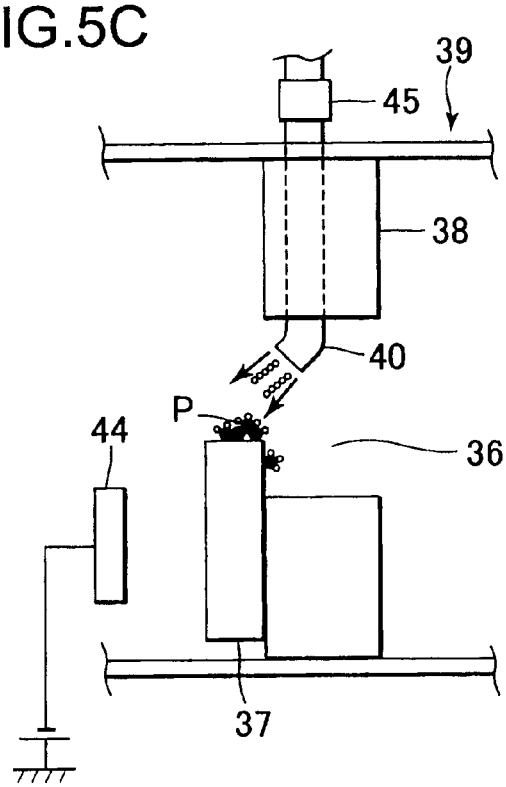
FIGS. 5C and 5D are process drawings of a cleaning process carried out in a fourth variation of the substrate processing system according to the second embodiment.
Figure 5D:
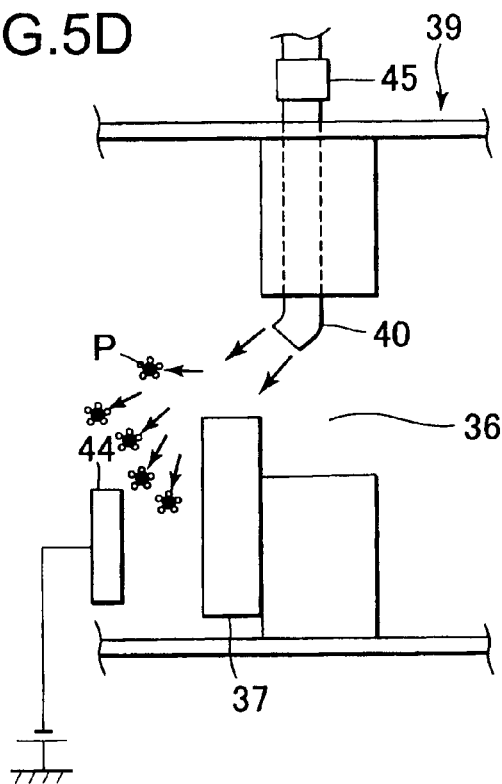

FIGS. 5C and 5D are process drawings of a cleaning process carried out in a fourth variation of the substrate processing system according to the present embodiment. In this variation, the substrate processing system has a single-pole electrode plate 44 disposed closer to the loader module 4 than the valve element 37, and the nozzle 40 has an adding unit 45 (removal promoting substance generating unit) disposed part way therealong, for adding single-pole ions of the reverse polarity to the polarity of the single-pole electrode plate 44 to a gas, thereby producing a single-pole ion added gas (removal promoting substance).

As shown in FIGS. 5C and 5D, first, before a wafer W is transferred in the substrate processing system, the nozzle 40 jets out a single-pole ion added gas produced by the adding unit 45 toward the valve element 37 (FIG. 5C).

Then, particles P attached to the valve element 37 are reliably scattered away through, for example, a disturbance caused by viscous force of the jetted single-pole ion added gas and attraction for the single-pole electrode plate 44 caused by an electrostatic force produced through charging the particles P on the reverse polarity to the polarity of the single-pole electrode plate 44 due to a physical collision of single-pole ions in the single-pole ion added gas, and the scattered particles P are attracted to the single-pole electrode plate 44 and enter into the transfer chamber 25 of the loader module 4 (FIG. 5D).

According to the cleaning process of FIGS. 5C and 5D described above, before the wafer W is transferred, the nozzle 40 jets out the single-pole ion added gas produced by the adding unit 45 toward the valve element 37. If particles P are attached to the valve element 37, the particles P are reliably scattered away through, for example, a disturbance caused by viscous force of the jetted single-pole ion added gas and attraction for the single-pole electrode plate 44 caused by an electrostatic force produced through charging the particles P on the reverse polarity to the polarity of the single-pole electrode plate 44 due to a physical collision of single-pole ions in the single-pole ion added gas, the scattered particles P are attracted to the single-pole electrode plate 44 and enter into the transfer chamber 25 of the loader module 4, and the particles P having entered into the transfer chamber 25 as well as air flowing into the transfer chamber 25 are caused to flow out from the interior of the substrate processing system. Thus, the particles P attached to the gate valve 39, in particular, the valve element 37 can be reliably removed, and the particles P can be discharged from the interior of the substrate processing system.

Figure 6A:
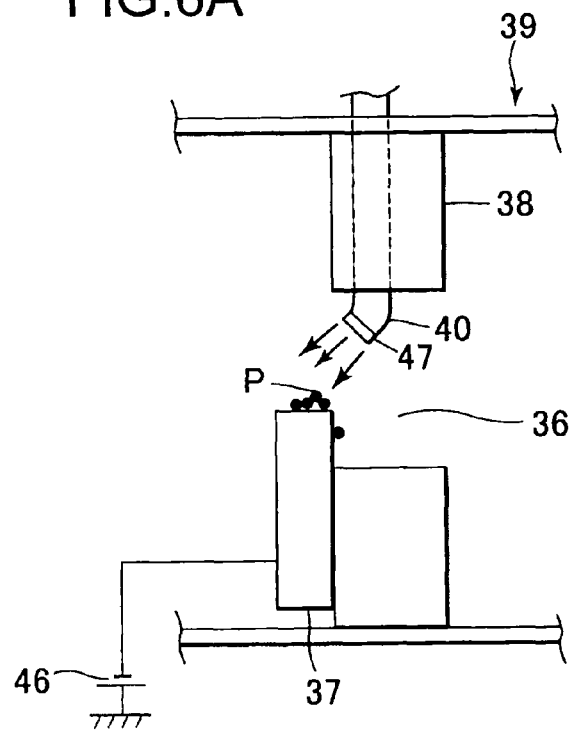
FIGS. 6A and 6B are process drawings of a cleaning process carried out in a fifth variation of the substrate processing system according to the second embodiment.
Figure 6B:
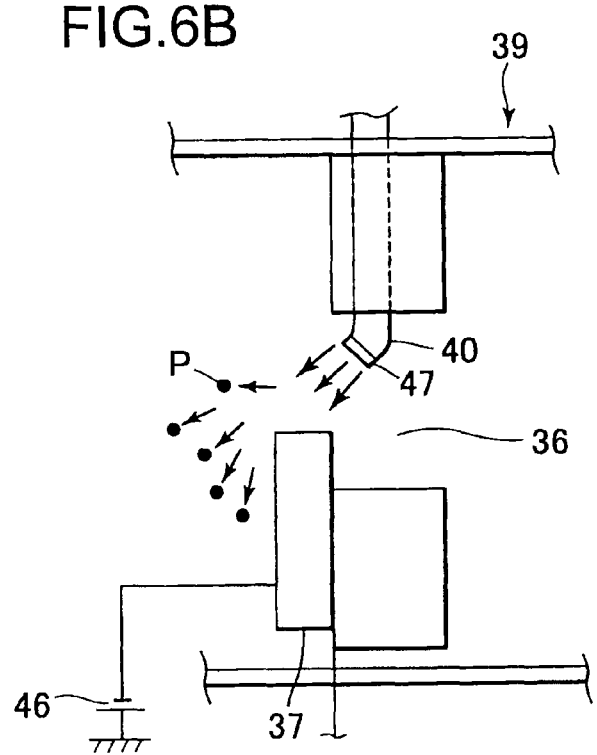

FIGS. 6A and 6B are process drawings of a cleaning process carried out in a fifth variation of the substrate processing system according to the present embodiment. In this variation, the nozzle 40 has a plasma-forming unit 47 (removal promoting substance generating unit) disposed at a distal end thereof, for turning a gas into plasma to produce ions (removal promoting substance), and the valve element 37 is charged on the reverse polarity to the polarity of the ions produced by the plasma-forming unit 47 since a direct-current power source 46 (charging mechanism) is connected to the valve element 37. It should be noted that the plasma-forming unit 47 turns a gas into plasma in an environment at normal pressure or reduced pressure. Examples of the gas that is turned into plasma include argon.

As shown in FIGS. 6A and 6B, first, before a wafer W is transferred in the substrate processing system, the nozzle 40 jets out ions produced by the plasma-forming unit 47 toward the valve element 37 (FIG. 6A).

Then, particles P including fine particles attached to the valve element 37 are reliably scattered away through sputtering caused by the jetted ions, and the scattered particles P enter into the transfer chamber 25 of the loader module 4 (FIG. 6B).

According to the cleaning process of FIGS. 6A and 6B described above, before the wafer W is transferred, the nozzle 40 jets out the ions produced by the plasma-forming unit 47 toward the valve element 37. If particles P including fine particles are attached to the valve element 37, the particles P are reliably scattered away through sputtering caused by the jetted ions, the scattered particles P enter into the transfer chamber 25 of the loader module 4, and the particles P having entered into the transfer chamber 25 as well as air flowing into the transfer chamber 25 are caused to flow out from the interior of the substrate processing system. Thus, the particles P including fine particles attached to the gate valve 39, in particular, the valve element 37 can be reliably removed, and the particles P can be discharged from the interior of the substrate processing system.

FIGS. 6C and 6D are process drawings of a cleaning process carried out in a sixth variation of the substrate processing system according to the present embodiment. In this variation, the nozzle 40 has a plasma-forming unit 47 (removal promoting substance generating unit) disposed at a distal end thereof, for turning a gas into plasma to produce radicals (removal promoting substance). It should be noted that the plasma-forming unit 47 turns a gas into plasma in an environment at normal pressure or reduced pressure.

As shown in FIGS. 6C and 6D, first, before a wafer W is transferred in the substrate processing system, the nozzle 40 jets out radicals produced by the plasma-forming unit 47 toward the valve element 37 (FIG. 6C).

Then, particles P including fine particles attached to the valve element 37 are scattered away through chemical reaction with the jetted radicals, and the scattered particles P enter into the transfer chamber 25 of the loader module 4 (FIG. 6D).

According to the cleaning process of FIGS. 6C and 6D described above, before the wafer W is transferred, the nozzle 40 jets out the radicals produced by the plasma-forming unit 47 toward the valve element 37. If particles P including fine particles are attached to the valve element 37, the particles P are scattered away through chemical reaction with the jetted radicals, the scattered particles P enter into the transfer chamber 25 of the loader module 4, and the particles P having entered into the transfer chamber 25 as well as air flowing into the transfer chamber 25 are caused to flow out from the interior of the substrate processing system. Thus, the particles P including fine particles attached to the gate valve 39, in particular, the valve element 37 can be removed, and the particles P can be discharged from the interior of the substrate processing system.

In the present variation, if particles P attached to the valve element 37 are CF-based deposits, it is preferred that the plasma-forming unit 47 produces oxygen radicals.

Although in the present variation, radicals are jetted out to particles P attached to the valve element 37, and the particles P and the radicals are caused to chemically react with each other so as to scatter away the particles P, a highly-reactive gas with a highly-reactive substance such as ozone or ammonia added thereto may be jetted out to particles attached to the valve element 37, and particles P and the highly-reactive substance may be caused to chemically react with each other so as to scatter away the particles P, or alternatively, particles P and ultraviolet light may be caused to chemically react with each other so as to scatter away the particles P.

Moreover, in the substrate processing systems according to the above described embodiments, the valve element 37 may have therein a coil 49 connected to a direct-current power source 48 as shown in FIG. 7A. By passing a current through the coil 49 from the direct-current power source 48, an induced electric field is produced around the valve element 37. As a result, an electromagnetic stress as a repulsive force that separates particles P from the valve element 37 can be caused to act on the particles P attached to the valve element 37, and hence removal of the particles P can be promoted. Further, since an induced field can be produced around the valve element 37, gas around the valve element 37 can be turned into plasma. In this case, ions and radicals in the plasma produced around the valve element 37 promote removal of the particles P.

Moreover, in the substrate processing systems according to the above described embodiments, the valve element 37 may have therein a heater 50 as shown in FIG. 7B. The heater 50 heats the valve element 37. As a result, a thermal stress as a removal force that removes particles P from the valve element 37 can be caused to act on the particles P attached to the valve element 37, and hence removal of the particles P can be promoted.

Figure 7C:
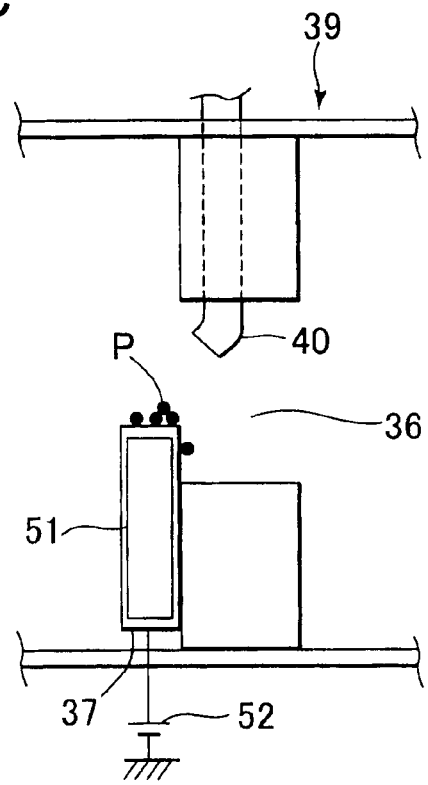
FIG. 7C is a sectional view schematically showing the construction of a variation of the substrate processing systems according to the above-mentioned embodiments and shows a case where the valve element has an electrode plate therein.

Moreover, in the substrate processing systems according to the above described embodiments, the valve element 37 may have an electrode plate 51 embedded in the vicinity of the surface of the valve element 37 as shown in FIG. 7C. A direct-current power source 52 is connected to the electrode plate 51, and a current is passed through the electrode plate 51 from the direct-current power source 52. As a result, an electrostatic force as a repulsive force that separates particles P from the valve element 37 can be caused to act on the particles P attached to the valve element 37, and hence removal of the particles P can be promoted.

Figure 7D:
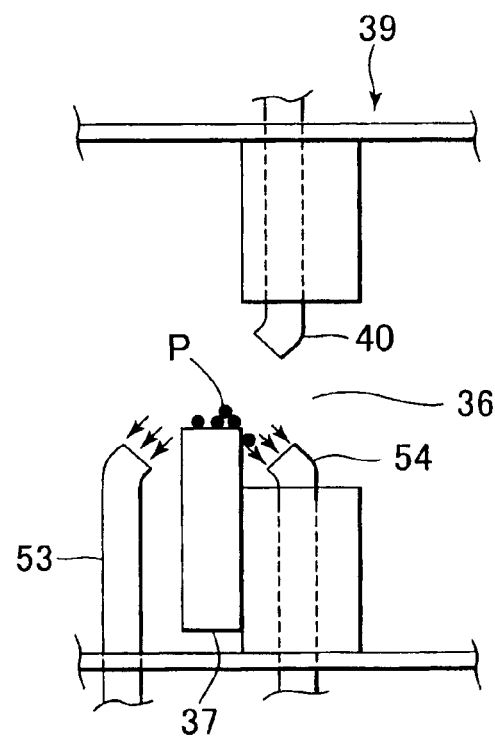
FIG. 7D is a sectional view schematically showing the construction of a variation of the substrate processing systems according to the above-mentioned embodiments and shows a case where there is a suction nozzle.
Figure 8A:
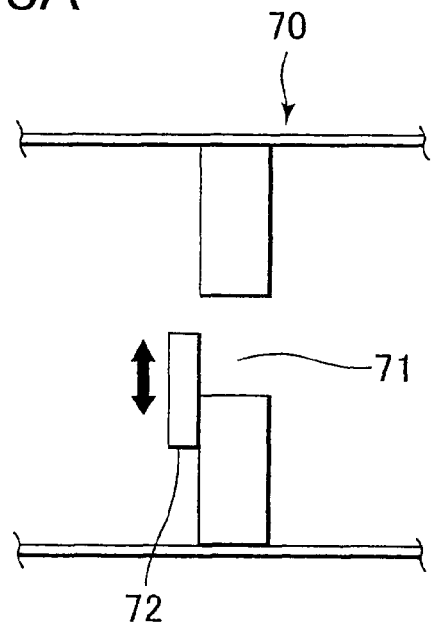
FIGS. 8A to 8D are sectional views useful in explaining the construction and operation of a conventional gate valve.
Figure 8B:
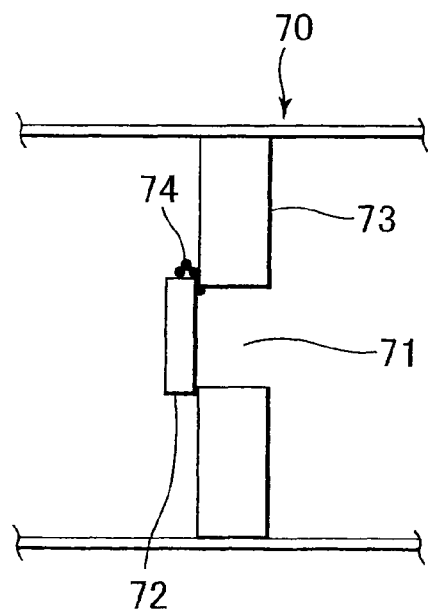
Figure 8C:
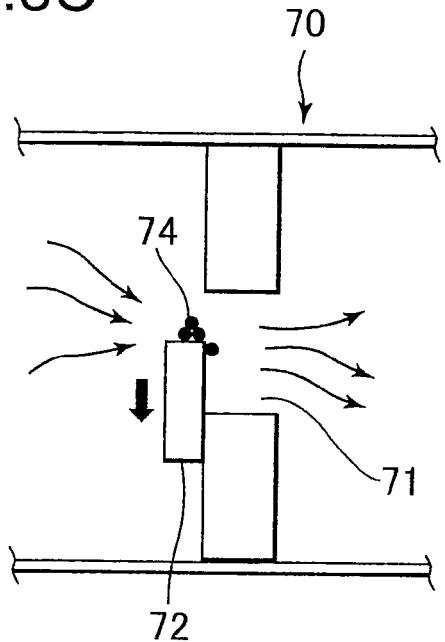
Figure 8D:
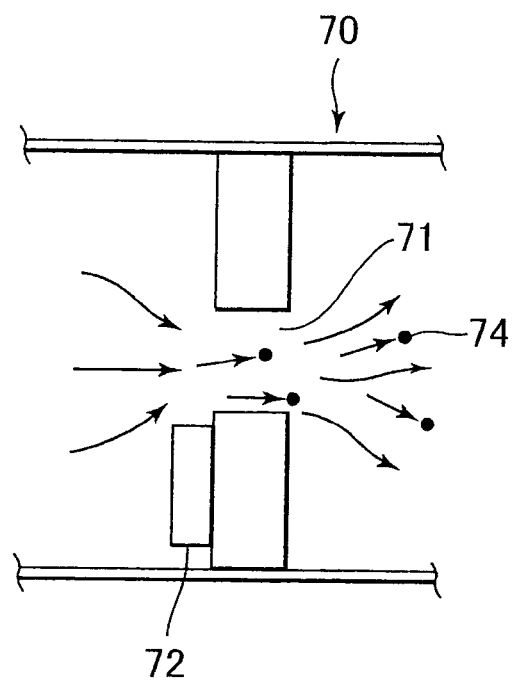

Moreover, in the substrate processing systems according to the above described embodiments, there may be a suction nozzle 53 (first suction mechanism) disposed closer to the loader module 4 than the valve element 37, and a suction nozzle 54 (second suction mechanism) disposed closer to the loader module 5 than the valve element 37 as shown in FIG. 7D. The suction nozzles 53 and 54 suck particles P scattered away from the valve element 37. As a result, the scattered particles P can be reliably discharged from the interior of the substrate processing system.

What is claimed is:

1. A substrate processing system including a gate valve that comprises a communication port that brings an atmospheric transfer chamber and an internal pressure variable transfer chamber that transfer a substrate into communication with each other and a valve element that opens and closes the communication port, comprising:
   a jetting mechanism adapted to jet out a removal promoting substance that promotes removal of foreign matter attached to the gate valve toward the valve element from the internal pressure variable transfer chamber side,
   wherein said jetting mechanism is provided so as to penetrate through a wall member defining the communication port, is exposed only at a distal end thereof from an end of the wall member to project out into the communication port, and the distal end is bent toward the valve element.

2. A substrate processing system according to claim 1, wherein said jetting mechanism comprises a removal promoting substance generating unit adapted to generate the removal promoting substance by heating a gas.

3. A substrate processing system according to claim 1, wherein said jetting mechanism comprises a removal promoting substance generating unit adapted to generate the removal promoting substance by applying a vibration to a gas.

4. A substrate processing system according to claim 3, wherein the vibration comprises an ultrasonic wave.

5. A substrate processing system according to claim 1, wherein said jetting mechanism comprises a removal promoting substance generating unit adapted to generate the removal promoting substance by mixing a first substance in gaseous form and a second substance in one of liquid form and solid form.

6. A substrate processing system according to claim 2, comprising a single-pole electrode plate disposed closer to the atmospheric transfer chamber than the valve element, and
   wherein said jetting mechanism comprises a removal promoting substance generating unit adapted to generate the removal promoting substance by adding single-pole ions of a reverse polarity to a polarity of said single-pole electrode plate to a gas.

7. A substrate processing system according to claim 1, wherein said jetting mechanism comprises a removal promoting substance generating unit adapted to generate the removal promoting substance by turning a gas into plasma.

8. A substrate processing system according to claim 7, further comprising a charging mechanism adapted to electrically charge the valve element.

9. A substrate processing system according to claim 1, wherein the valve element has therein one of a coil, a heater, and an electrode plate.

10. A substrate processing system according to claim 1, further comprising at least one of a first suction mechanism disposed closer to the atmospheric transfer chamber than the valve element, and a second suction mechanism disposed closer to the internal pressure variable transfer chamber than the valve element.

11. A substrate processing system according to claim 1, wherein said jetting mechanism comprises a nozzle.

12. A substrate processing system according to claim 1, wherein said jetting mechanism jets the removal promoting substance from the distal end when said jetting mechanism faces the foreign matter attached to an upper edge of the valve element.

* * * * *